United States Patent [19]

Chen et al.

[11] Patent Number: 4,584,205

[45] Date of Patent: Apr. 22, 1986

[54] METHOD FOR GROWING AN OXIDE LAYER ON A SILICON SURFACE

[75] Inventors: Teh-Yi J. Chen, Santa Clara; Anjan Bhattacharyya, Sunnyvale; William T. Stacy, San Jose; Charles J. Vorst, Saratoga; Albert Schmitz, Sunnyvale, all of Calif.

[73] Assignee: Signetics Corporation, Sunnyvale, Calif.

[21] Appl. No.: 626,841

[22] Filed: Jul. 2, 1984

[51] Int. Cl.$^4$ ............... H01L 21/473; H01L 21/427
[52] U.S. Cl. ........................................ 427/93
[58] Field of Search ........................................ 427/93

[56] References Cited

U.S. PATENT DOCUMENTS

| | | | |
|---|---|---|---|
| 4,154,873 | 5/1979 | Hickox | 427/93 |
| 4,167,915 | 9/1979 | Toole | 427/93 |
| 4,214,919 | 7/1980 | Young | 427/93 |
| 4,344,985 | 8/1982 | Goodman | 427/93 |
| 4,377,605 | 3/1983 | Yamamoto | 427/93 |

OTHER PUBLICATIONS

Marcus et al, "Polysilicon/SiO$_2$ Interface Microtexture and Dielectric Breakdown", J. Electrochem. Soc.: Solid State Science and Technology, vol. 129, No. 6, pp. 1282–1289, Jun., 1982.
Marcus et al, "The Oxidation of Shaped Silicon Surfaces", J. Electrochem. Soc.: Solid State Science and Technology, vol. 129, No. 6, pp. 1278–1282, Jun., 1982.
Irene, "Method to Reduce Defects in Very Thin SiO$_2$ Films", IBM TDB, vol. 21, No. 1, Jun. 1978, pp. 393, 394.

Primary Examiner—John D. Smith
Attorney, Agent, or Firm—Robert T. Mayer; Steven R. Biren

[57] ABSTRACT

In an improved method for growing an oxide layer on a silicon surface of a semiconductor body, the semiconductor body is first provided with a silicon surface. A first oxide layer portion is then grown over the silicon surface in a first thermal oxidation process at a temperature of less than about 1000° C. The semiconductor device is then annealed in a nonoxidizing ambient at a temperature above about 1000° C., and finally a second oxide layer portion is then grown over the first oxide layer portion in a second thermal oxidation process to complete the growth of the oxide layer. The silicon surface may be of either polycrystalline or monocrystalline material. This method avoids both the dopant out-diffusion problems associated with present high-temperature oxidation processes and the stress-related irregularities associated with known low-temperature oxidation processes.

9 Claims, No Drawings

METHOD FOR GROWING AN OXIDE LAYER ON A SILICON SURFACE

BACKGROUND OF THE INVENTION

The invention is in the field of semiconductor device manufacture, and relates more specifically to an improved technique for forming an oxide layer on a polycrystalline silicon (polysilicon) or monocrystalline silicon surface.

In the fabrication of both MOS and bipolar semiconductor devices, it is common to employ polysilicon or monocrystalline silicon layers for various purposes. Typically, a silicon dioxide (oxide) insulating layer is then grown over the silicon. This basic technique is used to fabricate numerous types of devices, including MOS and bipolar transistors, memory cells and capacitors.

However, it is well known in this art that there are certain problems associated with thermal oxide growth on silicon surfaces. For example, when oxide layers are grown on polysilicon surfaces at relatively high temperatures, above about 1000° C., the resulting dopant outdiffusion causes problems with device fabrication. These problems will only become greater as geometries shrink and packing densities increase in future generations of devices. On the other hand, when oxide layers are thermally grown on polysilicon surfaces at relatively low temperatures, below about 1000° C., various defects, including asperities in the polysilicon-oxide interface, silicon inclusions in the oxide layer, and cusps at the corners of the polysilicon, may be present. Thus, reducing the oxidation temperature in order to minimize dopant outdiffusion problems will result in various irregularities at and near the polysilicon-oxide interface, which will in turn reduce the dielectric breakdown voltage and reduce device reliability and yield. It has been determined that these irregularities are caused by stresses in the oxide layer, and that these stresses, and the resulting irregularities, increase with decreasing oxidation temperature.

A more detailed discussion of the interface problems associated with growing oxide on a polysilicon surface is contained in "Polysilicon/SiO$_2$ Interface Microtexture and Dielectric Breakdown", R. B. Marcus, T. T. Sheng, and P. Lin, J. Electrochem. Soc.: SOLID-STATE SCIENCE AND TECHNOLOGY, Vol. 129, No. 6, pp. 1282–1289, June, 1982. Additionally, problems associated with low-temperature oxidation of nonplanar silicon and polysilicon surfaces are discussed in "The Oxidation of Shaped Silicon Surfaces", R. B. Marcus and T. T. Sheng, J. Electrochem. Soc.: SOLID-STATE SCIENCE AND TECHNOLOGY, Vol. 129, No. 6, pp. 1278–1282, June, 1982. These references clearly describe the problems associated with low-temperature oxide growth, but offer no solution other than the obvious one of increasing the oxidation temperature. However, as noted above, this solution is not without its problems, as high-temperature oxide growth results in increased dopant outdiffusion, which is a significant problem today and which will become even more of a problem as device geometries shrink and packing density increases in the future.

It would therefore be desirable to have a process which avoids dopant outdiffusion problems associated with high oxidation temperatures, and at the same time avoids the stress-induced irregularities associated with low oxidation temperatures which degrade breakdown voltage, yield and reliability.

SUMMARY OF THE INVENTION

It is therefore an object of the present invention to provide an improved method of forming an oxide layer on a silicon surface which will avoid the dopant outdiffusion problems associated with present high-temperature oxidation processes.

It is a further object of the invention to provide an improved method of growing oxide on a silicon surface which will avoid the stress-related irregularities associated with known low-temperature oxidation processes.

In accordance with the invention, these objects are achieved by a method for growing an oxide layer on a silicon surface of a semiconductor body in which the semiconductor body is first provided with a silicon surface. A first oxide layer portion is then grown over at least a portion of the silicon surface in a first thermal oxidation process at a temperature of less than about 1000° C. The semiconductor body is then annealed in a nonoxidizing ambient at a temperature above about 1000° C., and a second oxide layer portion is then grown at least over the first oxide layer portion in a second thermal oxidation process to complete the growth of the oxide layer.

In the present invention, the drawbacks of the prior-art techniques as mentioned above are minimized by employing a multi-step process for growing the oxide layer. Initially, the first oxide layer portion is grown over the silicon surface at a relatively low temperature of less than about 1000° C. in order to avoid the dopant outdiffusion problems associated with higher-temperature oxidation techniques, Then, in order to reduce the various irregularities occurring at and near the silicon-oxide interface due to stresses caused by the relatively low-temperature oxidation process, the semiconductor body is annealed in a nonoxidizing ambient such as nitrogen at a temperature above about 1000° C. Finally, after the annealing step, the oxide layer is completed by growing a second oxide layer portion over the first portion to the desired thickness in a second thermal oxidation process. This second oxidation serves to improve the oxide quality by blunting the asperities and removing the inclusions created during the initial low-temperature oxidation.

It has been found that structures fabricated in accordance with the present method have an improved silicon-oxide structure, which in turn improves the dielectric breakdown performance, yield and reliability of the resulting devices.

DESCRIPTION OF THE PREFERRED EMBODIMENTS

The present method may be employed with a wide variety of different semiconductor devices which require an oxide layer over a silicon surface. For example, the present method may be used to fabricate both bipolar and MOS field effect transistors, as well as capacitors and memory cells.

In a first embodiment in accordance with the invention, a semiconductor body is provided with a patterned polysilicon surface in accordance with standard techniques well-known in the art. A first oxide layer portion is grown over at least a portion of the polysilicon surface in a first thermal oxidation process at a relatively low temperature of less than about 1000° C. For example, the first oxide layer portion may be grown to a thickness of about 500 angstroms by oxidizing at 900° C. for 70 minutes in a dry oxygen ambient. After the first thermal oxidation process, the semiconductor body is annealed in a nonoxidizing ambient at a temperature above about 1000° C. This may be accomplished, for example, by a high-temperature furnace annealing at 1150° C. for 3 minutes in a nitrogen ambient, or else by heatpulse annealing at about 1100° C. for 30 seconds.

Finally, the second oxide layer portion is grown at least over the first oxide layer portion in a second thermal oxidation process in order to obtain the final desired oxide layer thickness. The second thermal oxidation process may be a low-temperature process, such as oxidizing for 60 minutes in a dry oxygen ambient at 900° C., or alternatively, a high-temperature oxidation process at 1150° C. for 3.5 minutes may be employed. It should also be noted that the HiPO$_x$ (High Pressure Oxidation) polysilicon oxidation technique may be employed for the two oxidation steps. The resulting structure may then be processed to completion in accordance with standard semiconductor fabrication techniques for the desired type of device.

In a second embodiment, a similar technique may be used to grow thin oxide layers on a monocrystalline silicon surface. A first oxide layer portion is grown over a portion of a monocrystalline surface in a first thermal oxidation process at a relatively low temperature. For example, the first oxide layer portion may be grown to a thickness of about 30 angstroms at a temperature of about 950° C. The oxidized surface is then subjected to an annealing treatment in a nonoxidizing ambient at a higher temperature. The annealing step may typically be done in argon at 1050° C. for 1 hour. Finally, the second oxide layer portion may be grown in a conventional manner over the first oxide layer portion to achieve the final desired total oxide thickness, in this example 80 angstroms, grown at a temperature of 950° C. in a second thermal oxidation process. As in the first example, the resulting structure exhibits improved structural and electrical characteristics.

While the present invention has been described with reference to certain preferred embodiments, the invention is applicable to a broad range of products, and various changes in form and detail may be made to accommodate the particular type of device being manufactured without departing from the spirit and scope of the invention.

We claim:

1. A method for growing an oxide layer on a silicon surface of a semiconductor body, which comprises:
   providing said semiconductor body with said silicon surface;
   growing a first oxide layer portion over at least a portion of said silicon surface in a first thermal oxidation process at a temperature of less than or equal to about 950° C.; then
   annealing said semiconductor body in a nonoxidizing ambient at a temperature greater than or equal to about 1050° C.; and then
   growing a second oxide layer portion at least over said first oxide layer portion in a second thermal oxidation process to complete the growth of said oxide layer.

2. A method for growing an oxide layer as in claim 1, wherein said silicon surface comprises a patterned polysilicon surface.

3. A method for growing an oxide layer as in claim 2, wherein said first oxide layer portion is grown at a temperature of about 900° C. for about 70 minutes in a dry oxygen ambient and said annealing step is conducted at a temperature of at least about 1100° C. for about 3 minutes in a nitrogen ambient.

4. A method for growing an oxide layer as in claim 3, wherein said second oxide layer portion is grown at a temperature of about 900° C. for about 60 minutes in a dry oxygen ambient.

5. A method for growing an oxide layer as in claim 3, wherein said second oxide layer portion is grown at a temperature of about 1150° C. for about 3.5 minutes.

6. A method for growing an oxide layer as in claim 3, wherein said annealing step comprises heatpulse annealing at a temperature of about 1100° C. for about 30 seconds.

7. A method for growing an oxide layer as in claim 1, wherein said silicon surface comprises a monocrystalline surface.

8. A method for growing an oxide layer as in claim 7, wherein said first oxide layer portion is grown to a thickness of about 30 angstroms at a temperature of about 950° C., said annealing step is conducted in an argon ambient at a temperature of about 1050° C. for 1 hour, and said second oxide layer portion is grown at a temperature of 950° C. to achieve a total oxide thickness of about 80 angstroms.

9. A method for growing an oxide layer as in claim 1, wherein said first and second oxide layer portions are grown by a High Pressure Oxidation process.

* * * * *